United States Patent
Dennis et al.

(10) Patent No.: US 8,522,426 B2
(45) Date of Patent: Sep. 3, 2013

(54) VENT BLOCKING ON VENTED BALL GRID ARRAYS TO PROVIDE A CLEANER SOLUTION BARRIER

(75) Inventors: Robert H. Dennis, Haverhill, MA (US); Amanda Loehr, Tucson, AZ (US); Robert E. Morris, Tucson, AZ (US); Peter D. Patalano, North Chelmsford, MA (US); Aaron J. Stein, Santa Barbara, CA (US); John Stephens, Oxnard, CA (US); Harold L. Wieck, Tucson, AZ (US); Eli Holzman, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 661 days.

(21) Appl. No.: 12/794,735

(22) Filed: Jun. 5, 2010

(65) Prior Publication Data

US 2011/0296680 A1 Dec. 8, 2011

(51) Int. Cl.
*H05K 3/34* (2006.01)
*H05K 3/20* (2006.01)
*H05K 3/30* (2006.01)
*H05K 3/00* (2006.01)
*H01R 9/00* (2006.01)
*H01K 3/10* (2006.01)
*B29C 65/00* (2006.01)
*B32B 37/00* (2006.01)
*G05G 15/00* (2006.01)

(52) U.S. Cl.
USPC .......... 29/840; 29/831; 29/832; 29/843; 29/852; 156/349

(58) Field of Classification Search
USPC .......... 29/831, 832, 840, 843, 852; 257/667, 257/738, 788; 156/349
See application file for complete search history.

(56) References Cited

U.S. PATENT DOCUMENTS

| | | | |
|---|---|---|---|
| 5,296,738 A * | 3/1994 | Freyman et al. | 257/684 |
| 5,384,689 A * | 1/1995 | Shen | 361/761 |
| 5,612,576 A * | 3/1997 | Wilson et al. | 257/788 |
| 5,721,450 A * | 2/1998 | Miles | 257/667 |
| 6,014,318 A * | 1/2000 | Takeda | 361/764 |
| 6,080,932 A * | 6/2000 | Smith et al. | 174/524 |
| 6,242,802 B1 * | 6/2001 | Miles et al. | 257/738 |
| 6,358,780 B1 * | 3/2002 | Smith et al. | 438/127 |
| 6,490,166 B1 * | 12/2002 | Ramalingam et al. | 361/760 |
| 6,518,090 B2 * | 2/2003 | Dotta et al. | 438/106 |
| 6,809,407 B2 * | 10/2004 | Shimizu | 257/673 |
| 6,825,571 B2 * | 11/2004 | Taniguchi | 257/783 |
| 6,855,626 B2 * | 2/2005 | Sato et al. | 438/622 |

(Continued)

*Primary Examiner* — David Angwin
(74) *Attorney, Agent, or Firm* — Eric A. Gifford

(57) ABSTRACT

A vented BGA package is reconfigured by first applying a continuous bead of adhesive around the perimeter of the package to seal the gap between the lid and substrate. The continuous bead defines a channel through the pressure relief vents to a polarity through-hole in the lid. The BGA package is reflow soldered to a PWB at an elevated temperature using solder flux, clean or no-clean. The IC die achieves elevated temperature pressure relief through the pressure relief vents along the channel and out the polarity through-hole. After reflow a seal is applied to plug the polarity through-hole. The PWB is washed in an aqueous cleaner solution to remove flux residue. The continuous bead of adhesive and the seal form a cleaner solution barrier that prevents the solution from contacting conductors inside the package. The seal may be removed or left intact depending on the operating environment.

17 Claims, 7 Drawing Sheets

(56) References Cited

U.S. PATENT DOCUMENTS

| | | | |
|---|---|---|---|
| 7,054,161 B1* | 5/2006 | James | 361/760 |
| 7,126,210 B2* | 10/2006 | Chiu et al. | 257/667 |
| 7,358,617 B2* | 4/2008 | Cruz et al. | 257/784 |
| 7,435,626 B2* | 10/2008 | Uchida et al. | 438/126 |
| 7,534,716 B2* | 5/2009 | Chiu et al. | 438/614 |
| 7,683,477 B2* | 3/2010 | Otremba | 257/723 |
| 8,143,719 B2* | 3/2012 | Toh et al. | 257/723 |

* cited by examiner

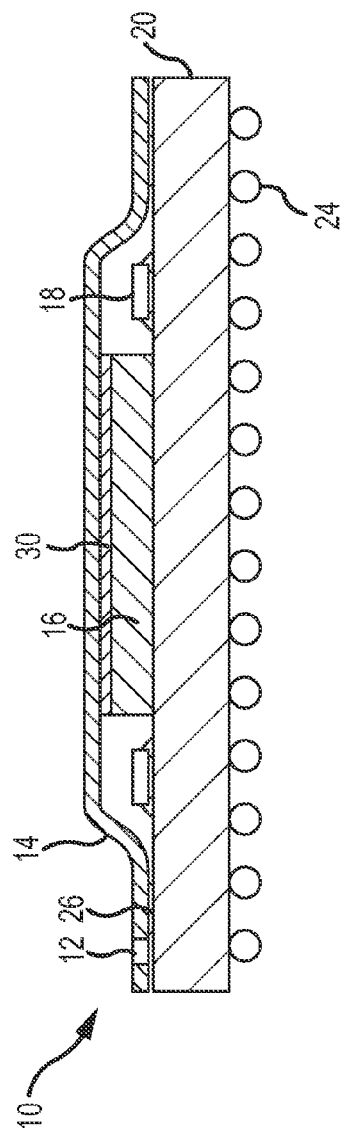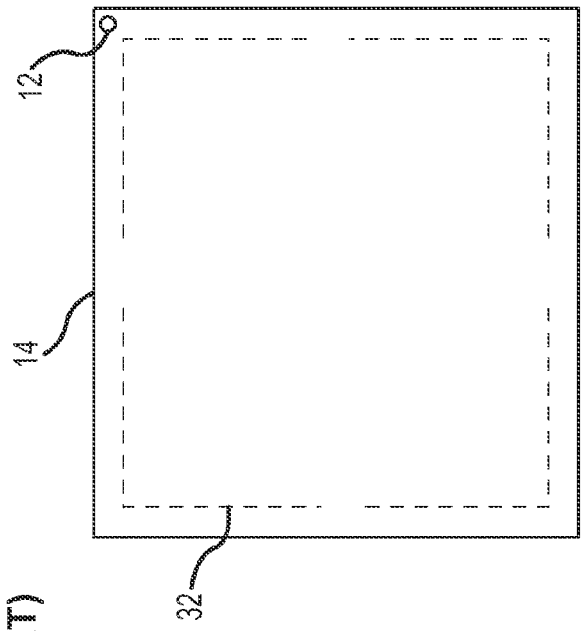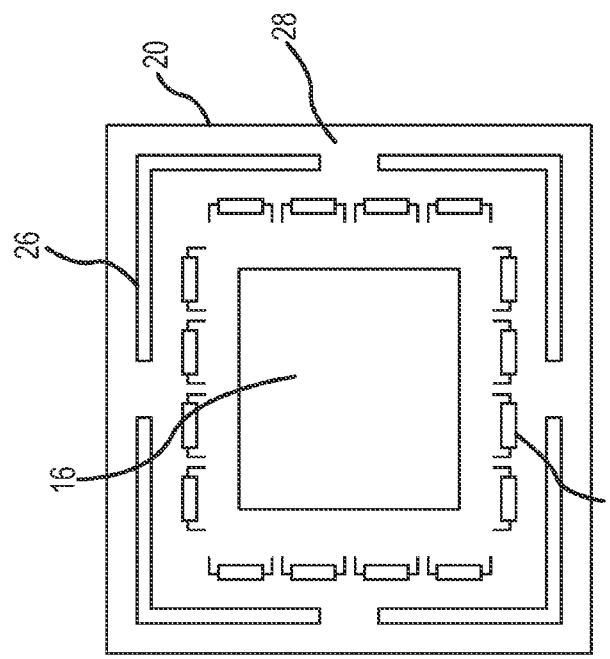
FIG. 1a (PRIOR ART)
FIG. 1b (PRIOR ART)
FIG. 1c (PRIOR ART)

US 8,522,426 B2

VENT BLOCKING ON VENTED BALL GRID ARRAYS TO PROVIDE A CLEANER SOLUTION BARRIER

GOVERNMENT RIGHTS

This invention was made with United States Government support under Contract Number HQ0276-08-C-0001 with the Department of Defense. The United States Government has certain rights in this invention.

BACKGROUND OF THE INVENTION

1. Field of the Invention

This invention relates to ball grid array (BGA) packages and more particularly to a method of vent blocking vented BGA packages to provide a cleaner solution barrier.

2. Description of the Related Art

A ball grid array (BGA) package is a type of surface-mount packaging used for integrated circuits (ICs). IC die and other electronic devices are mounted on an interposer substrate and conduct electrical signals through vias in the substrate to an array of solder balls attached to the bottom of the substrate. A lid is sealed to the substrate over the IC die and other electronic devices. A polarity marking such as an ink dot or through-hole is placed towards or at one corner of the package to identify the proper orientation of the package.

The BGA package is placed on a printed wire board (PWB) that carries copper pads in a pattern that matches the solder balls. The assembly is heated in a reflow oven causing the solder balls to melt. Surface tension causes the molten solder to hold the package in alignment with the PWB, at the correct separation distance, while the solder cools and solidifies.

In certain BGA packages vents are formed in the adhesive that seals the lid to the substrate. Venting prevents component pressurization from separating the lid from the substrate while exposed to elevated solder reflow temperatures. However the small vents allow the ingress of potentially corrosive, post-solder reflow aqueous cleaner solution but render rinsing ineffective for removing the cleaner solution. As a consequence, these commercial off-the-shelf (COTS) vented BGA packages are limited to use "no-clean" solder flux and no-clean processes.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a method of reconfiguring a vented BGA package for use with solder reflow and aqueous washing processes. The method finds applications in package designs in which the polarity marking is a polarity through-hole and is positioned outside the footprint of the vented lid attachment adhesive. The method is useful for adapting COTS vented BGA packages configured for a no-clean flux reflow solder process to packages that may be used with either clean or no-clean flux and subjected to an aqueous washing process to remove flux residue.

In an embodiment, a COTS no-clean flux vented BGA package is mounted to a PWB by first applying a continuous bead of adhesive around the perimeter of the COTS BGA package to seal the gap between the lid and substrate. The continuous bead defines a channel through the pressure relief vents to a polarity through-hole in the lid. The BGA package is reflow soldered to the PWB at an elevated temperature using solder flux, either clean or no-clean flux. The IC die achieves elevated temperature pressure relief through the pressure relief vents along the channel and out the polarity through-hole. After reflow a seal is applied to plug the polarity through-hole. The PWB is washed in an aqueous cleaner solution to remove flux residue. The continuous bead of adhesive and the seal form a cleaner solution barrier that prevents the solution from contacting conductors inside the package. The seal may be removed or left intact depending on the operating environment.

In another embodiment, a reconfigured vented BGA package comprises an array of solder balls on the bottom of the substrate. An integrated circuit (IC) die and other internal electrical devices with associated internal solder attachments and conductors are mounted on top of the substrate in electrical contact with the solder balls through vias in the substrate. A plurality of discrete beads of a first adhesive on the substrate around both the IC die and other devices attach a lid to the substrate and form pressure relief vents. The lid has a polarity through-hole formed therein positioned outside the footprint of the adhesive beads and suitably towards one corner of the package that indicates the proper orientation of the package. A continuous bead of a second adhesive around the perimeter of the BGA package seals the gap between the lid and substrate. The continuous bead and discrete beads define a channel through the pressure relief vents to the polarity through-hole. The package is provided with a seal to plug the polarity through-hole between the reflow soldering and washing processes. The seal may be left intact or removed depending on the operating environment of the package.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 1a through 1c are respectively an open size view of a commercial off-the-shelf (COTS) vented BGA package, a plan view of the die and substrate and a plan view of the lid;

DETAILED DESCRIPTION OF THE INVENTION

Figure 2A:
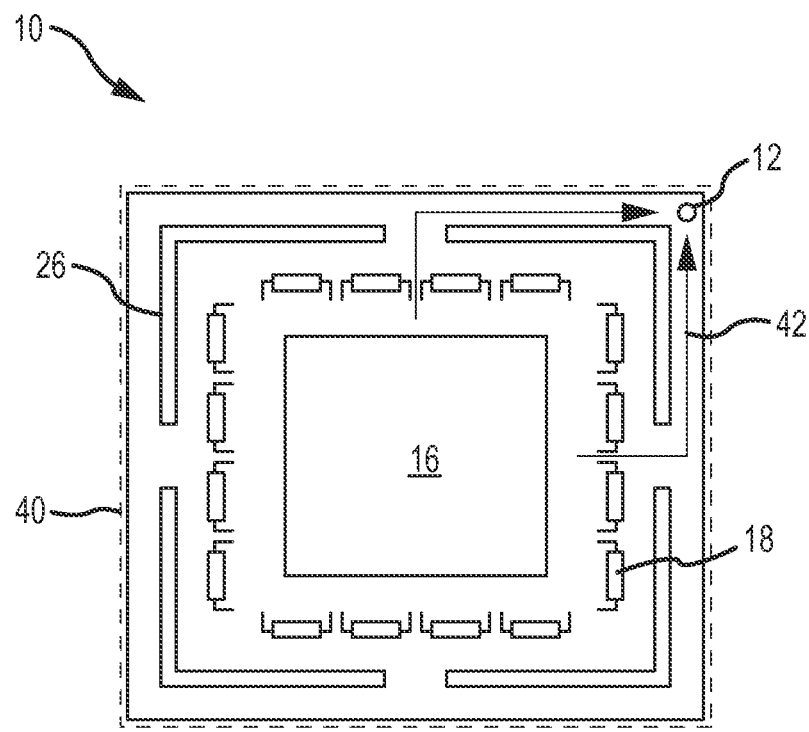
FIGS. 2a and 2b are a plan view looking through the lid and an open side view of a continuous bead of adhesive applied around the perimeter of the COTS vented BGA package.

The present invention provides a method of reconfiguring a vented BGA package for use with solder reflow and aqueous washing processes. The method finds applications in package designs in which the polarity marking is a polarity through-hole and is positioned outside the footprint of the vented lid attachment adhesive, typically near a corner of the package.

The method is useful for adapting COTS vented BGA packages configured for a no-clean flux reflow solder process to packages that may be used with either clean or no-clean flux and subjected to an aqueous washing process to remove flux residue.

FIGS. 1a through 1c depict an embodiment of a COTS vented BGA package 10 in which the polarity marking is a polarity through-hole 12 positioned at one corner of the lid 14. An IC die 16 and other electronic devices 18 with associated internal solder attachments and conductors are mounted on an interposer substrate 20 and conduct electrical signals through vias in the substrate to an array of solder balls 24 attached to the bottom of the substrate. Lid 14 is sealed to the substrate over the IC die and other electronic devices. The seal is formed with a plurality of discrete beads 26 of a lid attachment adhesive that are spaced to form vents 28. A thermally conductive adhesive 30 suitably attaches the lid to the surface of IC die 16. Polarity through-hole 12 lies outside the footprint 32 of the discrete beads lid attachment adhesive. This COTS package is configured for use with a "no-clean" solder flux As shown in FIGS. 2 through 7, the COTS vented BGA package 10 is reconfigured for use with either clean or no-clean flux and subjected to an aqueous washing process to remove flux residue. Many defense and some commercial products will require that the PWB be washed to remove flux residue regardless of whether the solder flux is clean or no-clean flux. As configured from the manufacturer the COTS package 10 is not amenable to a post-reflow wash that would expose the electronic devices 18, and particularly their exposed internal solder attachments and conductors, to the corrosive aqueous cleaner solution. Currently available aqueous cleaner solutions comprise a chemical monoethanolamine known in the industry as "MEA". Vents 28 are large enough to allow MEA inside the package where it may contact and degrade the electronic devices but too small for a rinse to effectively remove the MEA.

Figure 2B:
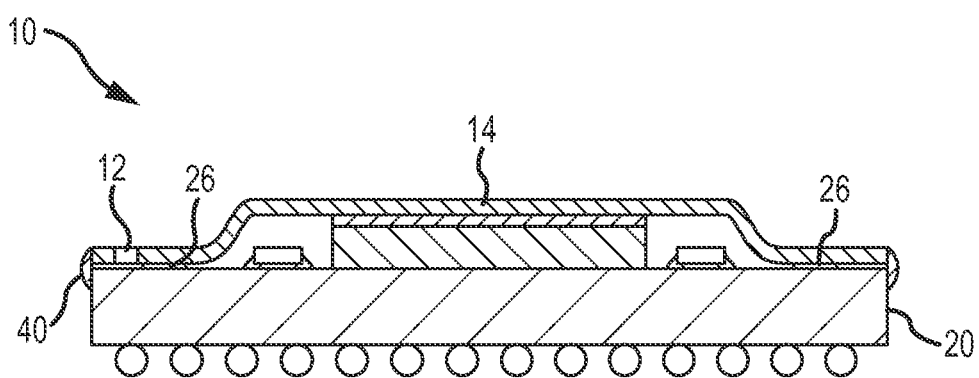

As shown in the open plan and open side views of FIGS. 2a and 2b, a continuous bead 40 of adhesive is applied around the perimeter of the BGA package to seal the gap between the lid 14 and substrate 20. The continuous bead 40 and discrete beads 26 define a channel 42 through the pressure relief vents 28 to the polarity through-hole 12. As shown, the adhesive is applied around the external edge of the package and adheres to the edges of the lid and substrate to seal the gap. Alternately, the adhesive may be injected between the lid and substrate if the sizing of the package and position of the polarity through-hole permits.

Any adhesive that forms a strong and permanent bond to seal the gap around the package may be used. An epoxy such as 3M EC-2216 is suitable for the task. EC-2216 provides a low modulus of elasticity. At the elevated temperatures experienced during reflow solder the low modulus allows the adhesive to geometrically distort under pressure from material thermal expansion mismatches between, for example, the lid and the substrate. Chemical stability maintains adhesion to the substrate materials to which it is attached.

Figure 3:
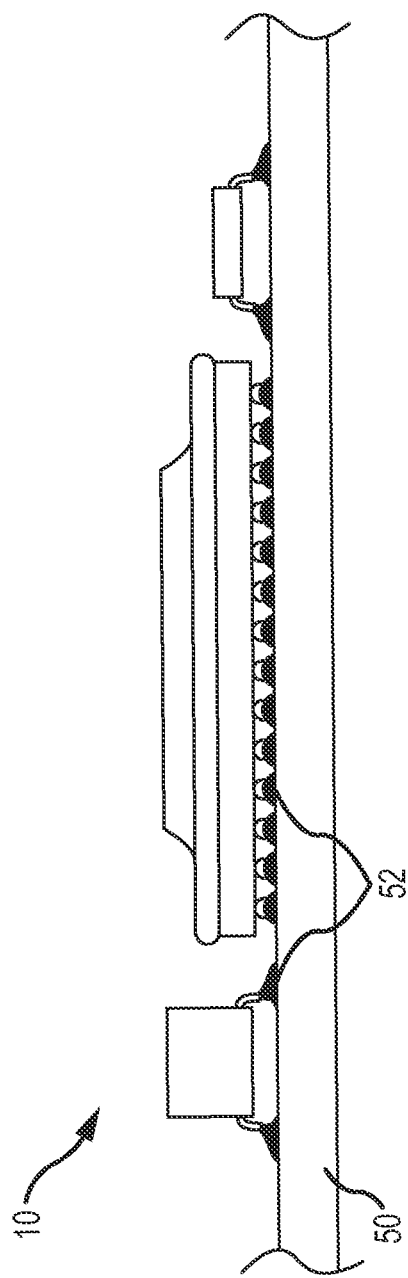
FIG. 3 is a side view of the reflow soldering of a BGA package and other electrical components to a printed wire board (PWB)

As shown in FIG. 3, the BGA package 10 undergoes reflow solder to a PWB 50 at an elevated temperature using solder flux that leaves behind solder flux residue 52. The assembly is suitably heated in a reflow oven causing the solder balls to melt. Surface tension causes the molten solder to hold the package 10 in alignment with the PWB, at the correct separation distance, while the solder cools and solidifies. The IC die achieves elevated temperature pressure relief through the pressure relief vents along the channel and out the polarity through-hole.

As shown in FIGS. 4a-4b and 5a-5b a seal is applied to plug the polarity through-hole 12. In this particular embodiment, a two-step process is used to apply a temporary seal that may be removed after washing to reopen the polarity through-hole. In other embodiments, a single-step process may be used to apply either a temporary or permanent seal. For example, a properly sized elastomeric plug with an interference fit into the through-hole may be used. Because the volatile content of flux residues evaporates with time and temperature the flux residues become less soluble and more difficult to clean with the passage of time. It is therefore preferable to have a process for applying the seal that can be done quickly and at room temperature.

Figure 4A:
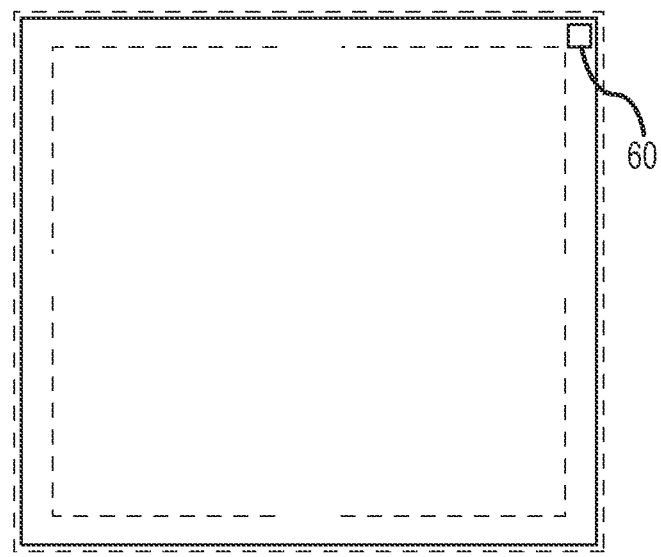
FIGS. 4a and 4b and 5a and 5b are plan and open side view of a two-step processor for applying a temporary seal to plug the polarity through-hole in the lid.
Figure 4B:
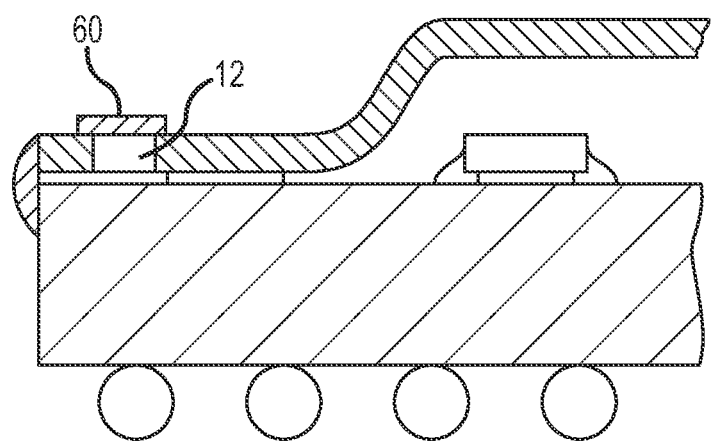
Figure 5A:
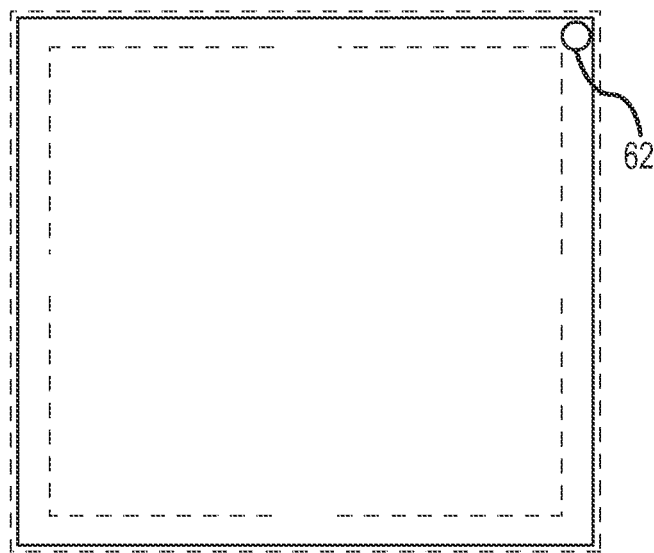
Figure 5B:
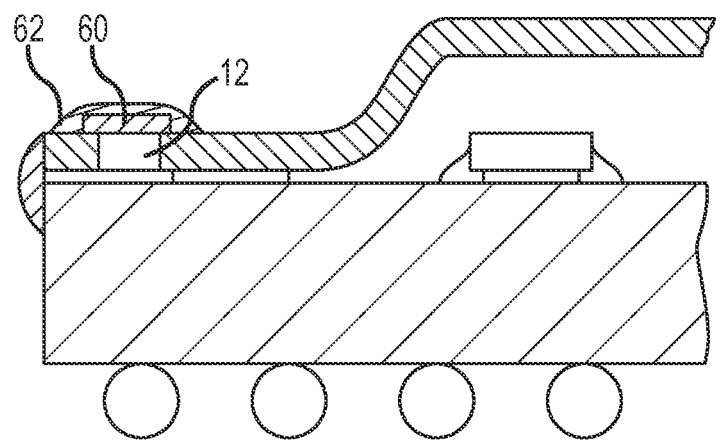
Figure 6:
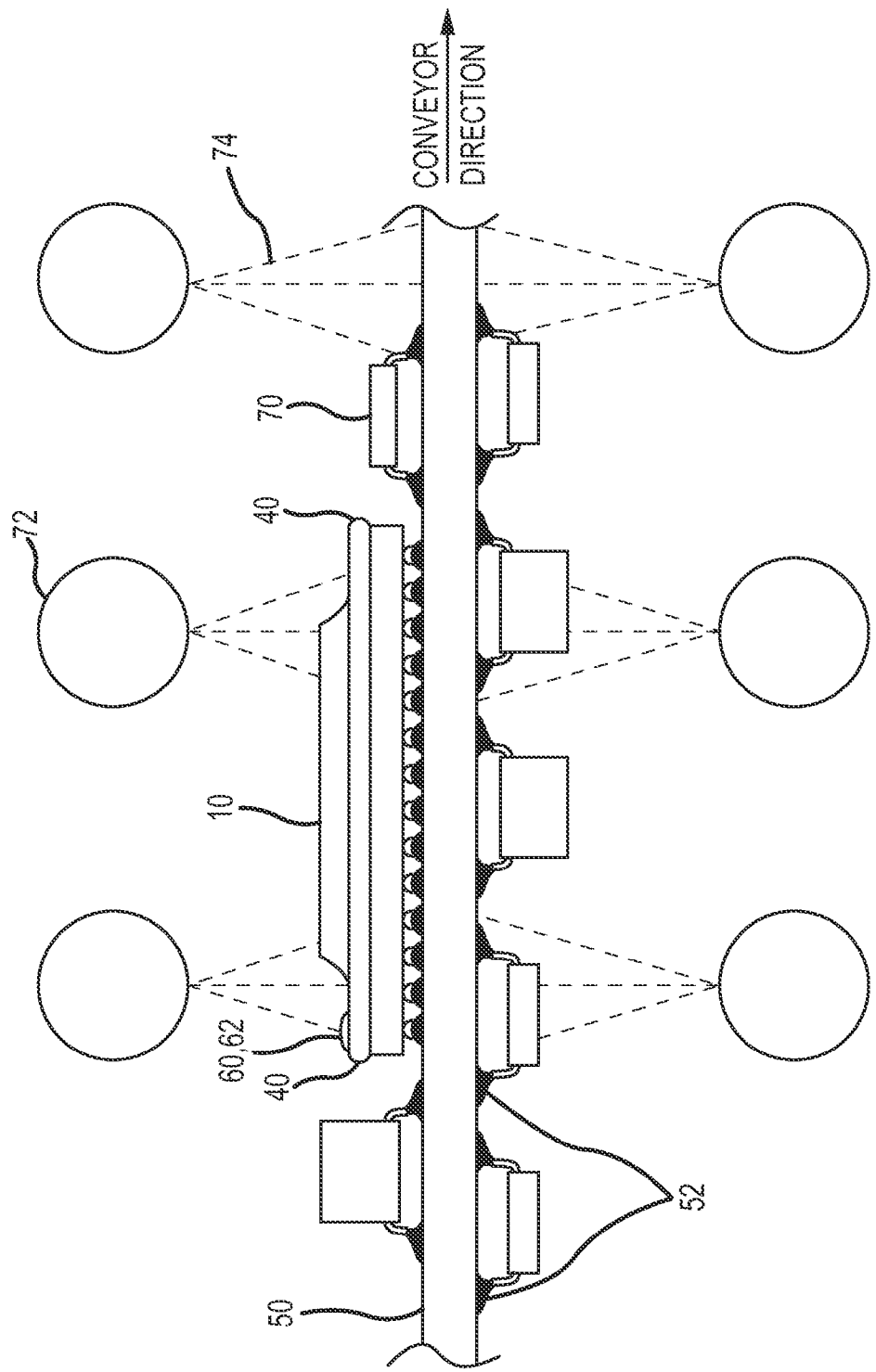
FIG. 6 is a diagram of washing the PWB and PBA package in an aqueous cleaner solution to remove solder flux residues.

In the two-step process, the first step illustrated in FIGS. 4a and 4b applies a pre-seal 60 over polarity through-hole 12. The object of the pre-seal is to cover the hole in a manner that prevents entry of sealing materials into the through hole and that is easy to remove after the wash. An adhesive tape or label such as a Bradylabel material is suitable. Bradylabel material is a heat activated pressure sensitive adhesive on a cellulose tape substrate. The adhesive does not require baking to gain sufficient adhesion for this purpose, which eases its removal. However, the Bradylabel material may not survive the wash process. The second step illustrated in FIGS. 5a and 5b applies an adhesive seal 62 over pre-seal 60 that adheres to the lid to seal the through-hole. The pre-seal prevents the adhesive seal from gravity slumping into the hole, which would make it difficult to remove. A suitable material for the adhesive seal is NuSil FS3-3730 fluorosilicone. This material cures quickly at room temperature.

Once the seal is applied, the PWB including the surface-mounted sealed BGA package 10 and additional electronic devices 70 mounted on both sides of the PWB is passed through a wash cycle to remove flux residues on the PWB. A plurality of pressurized spray manifolds 72 sprays an aqueous cleaner solution 74 onto the PWB to remove the flux. The continuous bead 40 of adhesive and the two-part seal 60/62 seal the BGA package to form a cleaner solution barrier that prevents the solution from penetrating into the package and contacting the internal conductors. The PWB is then suitably passed through a rinse cycle to remove any traces of the aqueous cleaner solution.

Figure 7:
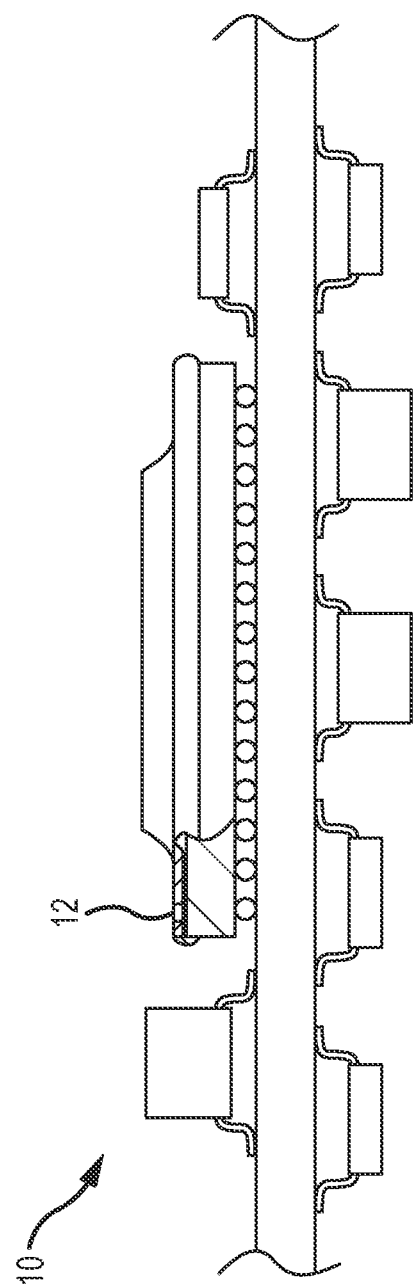
FIG. 7 is a partially open side view of the PWB in which the temporary seal has been removed.

In this embodiment, the two-part seal is removed as shown in FIG. 7 to reopen the polarity through-hole 12 in BGA package 10. Parts that end up in an operating environment in which they are exposed to moisture should be vented through an open through-hole. Parts that end up in an operating environment in which they are contained within a desiccated volume are not exposed to moisture. In this type of environment the seal may be left intact or removed.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of mounting ball grid array (BGA) packages to a printed wire board (PWB), comprising:
    providing a BGA package, said BGA package comprising a substrate, an array of solder balls, an integrated circuit (IC) die and other internal devices, a lid and a plurality of discrete beads of a first adhesive, wherein the array of solder balls is on the bottom of the substrate, said integrated circuit (IC) die and the other internal electrical devices have associated internal solder attachments and conductors on top of the substrate in electrical contact with the solder balls through vias in the substrate, a said plurality of discrete beads on the substrate around both the IC die and other devices to attach the lid to the substrate, form pressure relief vents and define a gap between the lid and the substrate around the perimeter of the package, said lid having a polarity through-hole formed therein outside the footprint of the discrete beads, said through-hole being an indicator of the orientation of the BGA package;

applying a continuous bead of a second adhesive around the perimeter of the BGA package to seal the gap between the lid and substrate, said continuous bead of the second adhesive and said discrete beads of the first adhesive defining a channel through the pressure relief vents to the polarity through-hole;

reflow soldering the BGA package to the PWB at an elevated temperature using solder flux, said IC die achieving elevated temperature pressure relief through the pressure relief vents along said channel and out the polarity through-hole;

applying a seal to plug the polarity through-hole; and washing the PWB and the BGA package in an aqueous cleaner solution to remove flux residues on the PWB, said continuous bead of the second adhesive and said seal sealing the BGA package to form a cleaner solution barrier that prevents the solution from contacting the internal conductors.

2. The method of claim 1, wherein each BGA package is a commercial off-the-shelf (COTS) package configured thr use with a no-clean flux.

3. The method of claim 2, wherein the BGA package is reflow soldered to the PWB using a no-clean flux.

4. The method of claim 2, wherein the BGA package is reflow soldered to the PWB using a flux that requires cleaning.

5. The method of claim 1, wherein the second adhesive that forms the continuous bead exhibits a modulus of elasticity that softens and becomes more elastic at the elevated temperatures during reflow soldering.

6. The method of claim 5, wherein the second adhesive comprises an epoxy adhesive.

7. The method of claim 1, wherein a third adhesive is applied to form a permanent seal to plug the polarity through-hole.

8. The method of claim 7, wherein the third adhesive comprises a fluorosilicone adhesive.

9. The method of claim 1, wherein applying a seal to plug the polarity through-hole comprises applying a pre-seal that covers the polarity through-hole but cannot survive the wash and applying a third adhesive over the pre-seal that seals to the lid but does not penetrate into the through-hole, further comprising the step of removing the third adhesive and pre-seal after washing to reopen the polarity through-hole.

10. The method of claim 9, wherein the pre-seal comprises a label or piece of tape.

11. The method of claim 9, wherein the second and third adhesives are different adhesives.

12. The method of claim 1 further comprising:
removing the seal after washing to reopen the polarity through-hole and said channel.

13. The method of claim 1, wherein the aqueous cleaner solution comprises monoethanolamine (MEA).

14. The method of claim 1, wherein the polarity through-hole is positioned towards one corner of the package.

15. The method of claim 1, wherein the continuous bead is applied around the perimeter of the BGA package to adhere to the edges of the lid and substrate to seal the gap between the lid and substrate.

16. A method of mounting a commercial off-the-shelf (COTS) ball grid array (BGA) package configured for use with a no-clean flux to a printed wire board (PWB), said package comprising a substrate and an array of solder balls on the bottom of the substrate, an integrated circuit (IC) die and other internal electrical, devices with associated internal solder attachments and conductors on top of the substrate in electrical contact with the solder balls through vias in the substrate, a lid and a plurality of discrete beads of a first adhesive on the substrate around both the IC the and other devices that attach the lid to the substrate, form pressure relief vents and define a gap between the lid and the substrate around the perimeter of the package, said lid having a polarity through-hole formed therein outside the discrete beads towards one corner of the package, said through-hole being an indicator of the orientation of the BGA package, the method comprising:

applying a continuous bead of a second adhesive around the perimeter of the COTS BGA package to seal the gap between the lid and substrate, said continuous bead of the second adhesive and said discrete beads of the first adhesive defining a channel through the pressure relief vents to the polarity through-hole:

reflow soldering the BGA package to the PWB at an elevated temperature using solder flux, said IC die achieving elevated temperature pressure relief through the pressure relief vents along said channel and out the polarity through-hole;

applying a seal to plug the polarity through-hole; and washing the PWB and the BGA package in an aqueous cleaner solution to remove flux residues on the PWB, said continuous bead of the second adhesive and said seal sealing the BGA package to form a cleaner solution barrier that prevents the solution from contacting the internal conductors.

17. A method of mounting a commercial off-the-shelf (COTS) ball grid array (BGA) package configured for use with a no-clean flux to a printed wire board (PWB), said package comprising a substrate and an array of solder balls on the bottom of the substrate, an integrated circuit (IC) die and other internal electrical devices with associated internal solder attachments and conductors on top of the substrate in electrical contact with the solder balls through vias in the substrate, a lid and a plurality of discrete beads of a first adhesive on the substrate around both the IC die and other devices that attach the lid to the substrate, form pressure relief vents and define a gap between the lid and the substrate around the perimeter of the package, said lid having a polarity through-hole formed therein outside the discrete beads towards one corner of the package, said through-hole being an indicator of the orientation of the BGA package, the method comprising:

applying a continuous bead of as second adhesive around the perimeter of the BGA package to seal the gap between the lid and substrate, said continuous bead of the second adhesive and said discrete beads of the first adhesive defining a channel through the pressure relief vents to the polarity through-hole;

reflow soldering the BGA package to the PWB at an elevated temperature using solder flux, said IC die achieving elevated temperature pressure relief through the pressure relief vents along said channel and out the polarity through-hole;

applying a pre-seal to cover the polarity through-hole;
applying as seal of a third adhesive over the pre-seal that seals to the lid;
washing the PWB and the BGA package in an aqueous cleaner solution to remove flux residues on the MB, said continuous head of the second adhesive and said seal of the third adhesive sealing the BGA package to form a cleaner solution barrier that prevents the solution from contacting the internal conductors; and
removing the seal and pre-seal to reopen the polarity through-hole and said channel.

* * * * *

UNITED STATES PATENT AND TRADEMARK OFFICE
CERTIFICATE OF CORRECTION

PATENT NO. : 8,522,426 B2
APPLICATION NO. : 12/794735
DATED : September 3, 2013
INVENTOR(S) : Robert H. Dennis et al.

Page 1 of 1

It is certified that error appears in the above-identified patent and that said Letters Patent is hereby corrected as shown below:

In the Claims

In column 6, claim 16, line 14, delete "the" and insert --die--;

In column 7, claim 17, line 5, delete "MB" and insert --PWB--.

Signed and Sealed this
Twenty-second Day of October, 2013

Teresa Stanek Rea
*Deputy Director of the United States Patent and Trademark Office*